United States Patent [19]

Kihara et al.

[11] Patent Number: 5,524,022
[45] Date of Patent: Jun. 4, 1996

[54] DIGITAL GRAPHIC EQUALIZER

[75] Inventors: Hisashi Kihara; Shuichi Mori; Akira Kanagawa; Atsushi Makino; Shinya Honjo; Masayuki Kato, all of Kawagoe, Japan

[73] Assignee: Pioneer Electronic Corporation, Tokyo, Japan

[21] Appl. No.: 288,215

[22] Filed: Aug. 9, 1994

[30] Foreign Application Priority Data

Aug. 24, 1993 [JP] Japan ................... 5-209146

[51] Int. Cl.⁶ .................... G10K 15/00; H03H 7/30
[52] U.S. Cl. ........................ 375/229; 375/350
[58] Field of Search .................... 375/299–230, 375/232, 350; 364/724.2; 333/18, 28 R; 381/103

[56] References Cited

U.S. PATENT DOCUMENTS 4,621,355  11/1986  Hirosaki et al. ............... 375/230
4,891,841   1/1990  Bohn .............................. 381/98

*Primary Examiner*—Young T. Tse
*Attorney, Agent, or Firm*—Sughrue, Mion, Zinn, Macpeak & Seas

[57] ABSTRACT

A digital graphic equalizer for obtaining a boost characteristic and an attenuation characteristic using band pass filters, each constituted by a digital filter, and an adder. For a boost characteristic, an input signal is supplied to first band pass filters and resultant filtered signals and the input signal are added by a first adder. For an attenuation characteristic, the output signal of a second adder is fed back to second band pass filters and resultant filtered signals and the input signal are added by a second adder.

2 Claims, 15 Drawing Sheets

DIGITAL GRAPHIC EQUALIZER

BACKGROUND OF THE INVENTION

1. Field of the Invention

The present invention relates to a digital graphic equalizer, and, more particularly, to a digital graphic equalizer which has a boost characteristic and an attenuation characteristic which are symmetrical to each other with respect to a reference level, and small S/N deterioration.

2. Description of the Related Art

Audio systems typically use a graphic equalizer which can freely change the frequency characteristic of a reproduced signal to create the desired reproduction sound field characteristic. In particular, due to the recent development of the digital signal processing technology, a digital graphic equalizer which uses a digital filter becomes popular. The circuit functions of such a digital graphic equalizer are generally accomplished on a software basis using a DSP (digital signal processor).

FIG. 1 shows one example of a digital graphic equalizer in which a plurality of equalizers $51_1$ to $51_n$ each constituted by an IIR (Infinite Impulse Response) digital filter are cascade-connected. By shifting the center frequencies of the equalizers $51_1$ to $51_n$ slightly from one another, the equalizers $51_1$ to $51_n$ as a whole achieve the mixed boost characteristic that is shown in FIG. 2.

FIG. 3 shows one example of a digital graphic equalizer in which a plurality of band pass filters $61_1$ to $61_n$ each constituted by an IIR digital filter are connected in parallel. In this case too, the band pass filters $61_1$ to $61_n$ as a whole achieve the mixed boost characteristic that is shown in FIG. 4 by shifting the center frequencies of the band pass filters $61_1$ to $61_n$ slightly from one another.

This type of graphic equalizer executes attenuating as well as boosting. It is desirable that the boost characteristic and the attenuation characteristic form curves which are symmetrical to each other with respect to a reference level. With regard to the cascade-connected type digital graphic equalizer shown in FIG. 1, the curves of the boost characteristic and the attenuation characteristic are approximately symmetrical to each other with respect to the reference level. However, the mixed amplitude varies greatly and great attenuation must be given previously to avoid saturation, particularly, at a full boosting time, resulting in deterioration of the S/N ratio.

The parallel type digital graphic equalizer shown in FIG. 3 cannot have the boost characteristic and the attenuation characteristic which are symmetrical to each other. This will be explained more specifically with reference to the case where the digital graphic equalizer in FIG. 3 is constituted by band pass filters $61_1$ to $61_n$. A transfer function at the boosting time (hereinafter referred to as "boost-mode transfer function"), $H_{BOOST}(Z)$, is expressed by $$H_{BOOST}(Z) = 1 + H_{BPF1}(Z) + H_{BPF2}(Z) + \ldots + H_{BPFn}(Z) \quad (1)$$

where $H_{BPF1}(Z)$ to $H_{BPFn}(Z)$ are transfer functions of the individual band pass filters. Assuming that $H_{ATTEN}(Z)$ is a transfer function at the attenuating time (hereinafter referred to as "attenuation-mode transfer function") which provides a frequency characteristic vertically symmetrical to the frequency characteristic given by the boost-mode transfer function $H_{BOOST}(Z)$, $H_{ATTEN}(Z)$ and $H_{BOOST}(Z)$ should have a relationship of $H_{ATTEN}(Z)=1/H_{BOOST}(Z)$. Thus, $$\begin{aligned}H_{ATTEN}(Z) &= 1/H_{BOOST}(Z) \\ &= 1/(1 + H_{BPF1}(Z) + H_{BPF2}(Z) \\ &\quad + \ldots + H_{BPFn}(Z))\end{aligned} \quad (2)$$

If this transfer function $H_{ATTEN}(Z)$ could be realized at the attenuating time, the boost characteristic and attenuation characteristic would form symmetrical curves with respect to the reference level. Since the circuit structure shown in FIG. 3 is designed to provide the transfer function $H_{BOOST}(Z)$, however, this circuit structure in FIG. 3 alone cannot provide the boost characteristic and attenuation characteristic that form symmetrical curves with respect to the reference level.

As one solution to this problem, the phases of the outputs of the individual band pass filters in FIG. 3 are inverted and the resultant values are then added (i.e., subtracted). The transfer function in this case, $H'_{ATTEN}(Z)$ is expressed by $$H'_{ATTEN}(Z)=1-H'_{BPF1}(Z)-H'_{BPF2}(Z)-\ldots-H'_{BPF2}(Z) \quad (3)$$

where $H'_{BPF1}(Z)$ to $H'_{BPFn}(Z)$ are new transfer functions of the individual band pass filters.

By re-setting the transfer functions $H'_{BPF1}(Z)$ to $H'_{BPFn}(Z)$ of the individual band pass filters $61_1$ to $61_n$ so that the transfer function $H'_{ATTEN}(Z)$ approximately equals the attenuation-mode transfer function $H_{ATTEN}(Z)$, i.e., $H'_{ATTEN}(Z) \approx H_{ATTEN}(Z)$, therefore, even the circuit in FIG. 3 can provide the attenuation-mode and boost-mode characteristics that form approximately symmetrical curves.

However, the above scheme involves complex computations to obtain new transfer functions $H'_{BPF1}(Z)$ to $H'_{BPFn}(Z)$, making it difficult to obtain good approximation. In the case where the interval between center frequencies of adjoining bands is narrow and the foot portions of frequency characteristics overlap, in particular, if one band characteristic is to be changed, a satisfactory approximation is not obtained unless the characteristics of the band pass filters of the adjoining bands are also changed.

Further, the above scheme requires a coefficient table covering all the combinations of the levels of the entire bands, so that as the number of bands increases, the amount of data becomes enormous. This increases the memory capacity for storing such vast amount of data and increases the load of a DSP or a control microprocessor which performs the computations. This scheme is therefore hardly practical.

SUMMARY OF THE INVENTION

It is therefore an object of the present invention to provide a digital graphic equalizer which has the boost characteristic and attenuation characteristic that are symmetrical curves with respect to the reference level, and has small S/N deterioration.

According to the present invention, there is provided a digital graphic equalizer having band pass filters, each constituted by a digital filter, which supplies an input signal to the band pass filters and adds resultant filtered signals and the input signal to obtain a desired boost characteristic in a boost mode, and feeds an output signal back to the band pass filters and adds resultant filtered signals and the input signal to obtain a desired attenuation characteristic in an attenuation mode. In addition, delay means may be inserted in a feedback loop in the attenuation mode so that feedback is executed with a predetermined delay.

DETAILED DESCRIPTION OF THE PREFERRED EMBODIMENTS

To begin with, the principle of the present invention will be described with reference to FIGS. 5A and 5B.

Figure 5A:
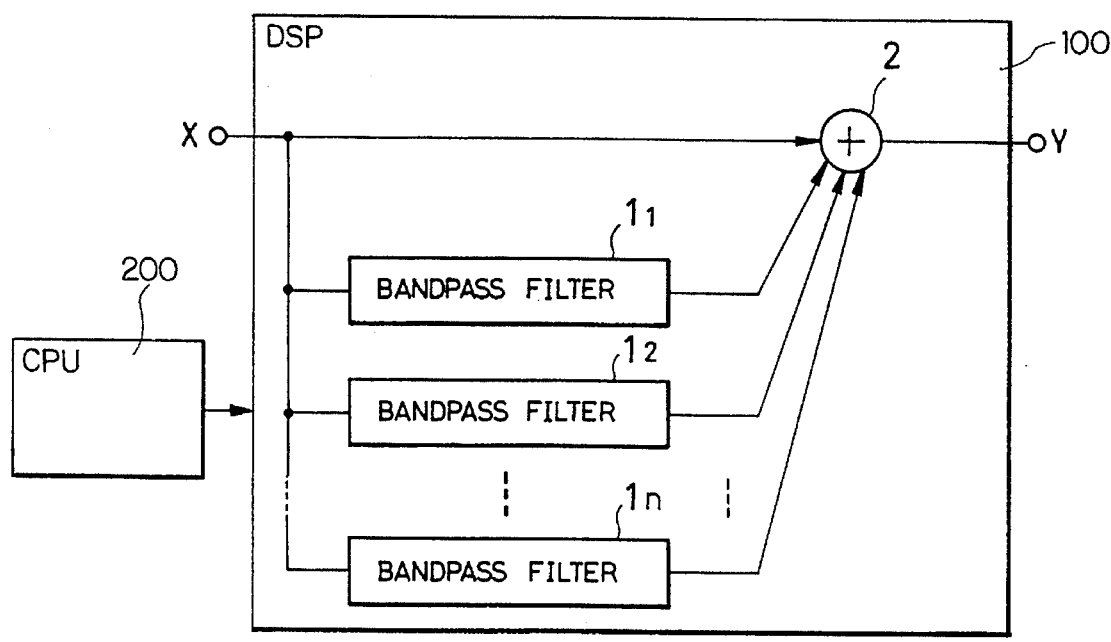
FIGS. 5A and 5B are diagrams for explaining the first principle of the present invention.
Figure 5B:
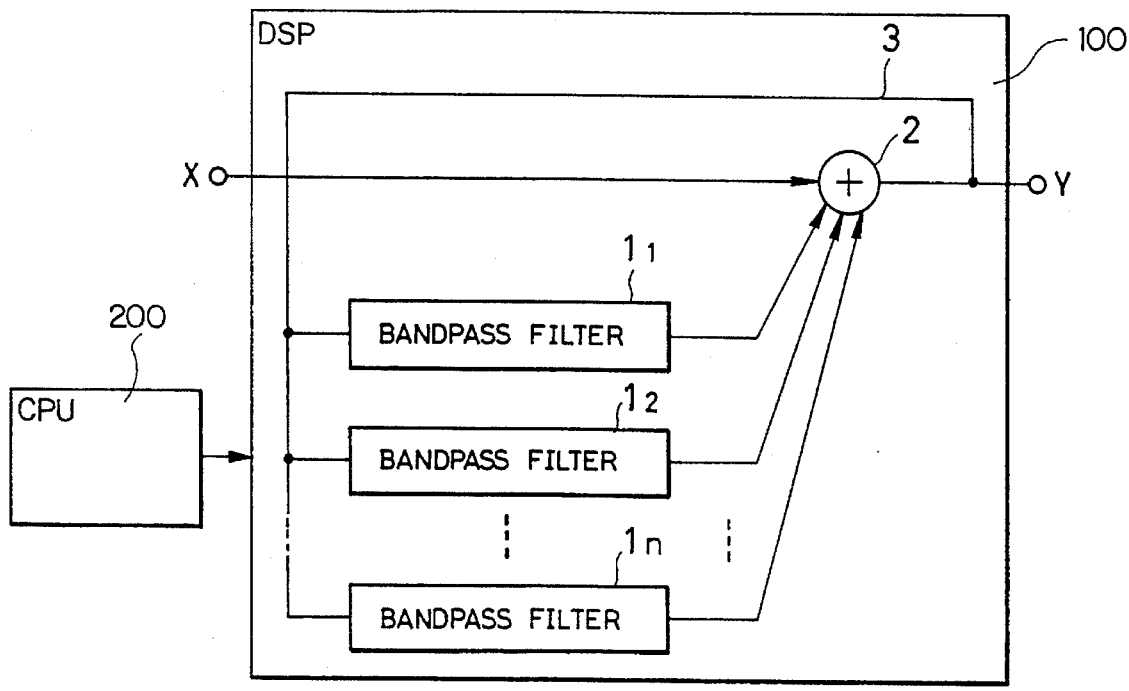

FIG. 5A shows the circuit structure of the present invention in a boost mode, and FIG. 5B the circuit structure in an attenuation mode. Reference numerals "$1_1$" to "$1_n$" denote band pass filters each constituted by a digital filter, "2" is an adder, and "3" is a feedback loop. It will be appreciated that FIGS. 5A and 5B illustrate boost and attenuation modes of operation, respectively, of a digital signal processor (DSP) 100, which advantageously may be operated by a central processing unit (CPU) 200.

Assuming that $H_{BPF1}(Z)$ to $H_{BPFn}(Z)$ are transfer functions of the individual band pass filters $1_1$ to $1_n$ in the boost-mode circuit shown in FIG. 5A, a transfer function of the whole circuit, $H_{BOOST}(Z)$, is given by $$H_{BOOST}(Z)=1+H_{BPF1}(Z)+H_{BPF2}(Z)+\ldots+H_{BPFn}(Z) \quad (4)$$

If the output of the adder 2 is given through the feedback loop 3 as inputs to the individual band pass filters $1_1$ to $1_n$ in the attenuation circuit shown in FIG. 5B, a transfer function of the whole circuit, $H_{ATTEN}(Z)$, is given by $$H_{ATTEN}(Z)=1/(1-H_{BPF1}(Z)-H_{BPF2}(Z)-\ldots-H_{BPFn}(Z)) \quad (5)$$

If the individual band pass filters are designed so that their outputs are subjected to subtraction, therefore, the transfer functions of the two circuits expressed by the equations (4) and (5) have the following relation which apparently shows that the boost-mode characteristic and attenuation-mode characteristic form symmetrical curves.

$$H_{ATTEN}(Z)=1/H_{BOOST}(Z) \quad (6)$$

The present invention is based on the above principle so that the digital graphic equalizer is switched to the circuit structure shown in FIG. 5A in the boost mode and is switched to the structure shown in FIG. 5B in the attenuation mode. This design can provide symmetrical curves with respect to the reference level without changing the circuit constants of the individual circuit elements in each of the band pass filters $1_1$ to $1_n$ by simply switching the connection of the feedback loop 3 and changing the addition of the outputs of the individual band pass filters by the adder 2 to a subtracting operation.

The attenuation-mode circuit in FIG. 5B includes the feedback loop 3 with no delay. With the presence of such an undelayed feedback loop, many repetitive computations should be performed and the resultant values should be converged and approximated in order to realize the circuit with a DSP. Depending on the processing speed of the DSP in use, therefore, the computation by the attenuation-mode circuit in FIG. 5B may not be carried out in real time.

Figure 6:
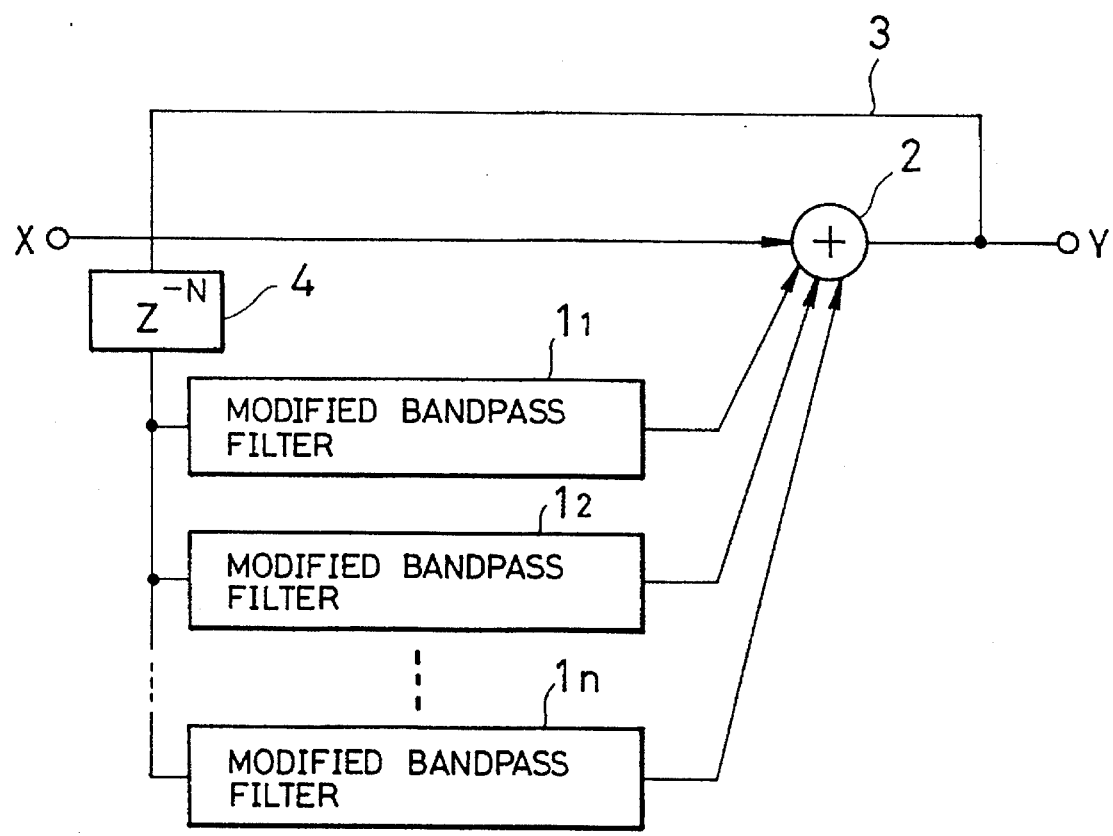
FIG. 6 is a diagram for explaining the second principle of the present invention.

According to the present invention, even in such case, delay means 4 is inserted in the feedback loop 3 to impart a predetermined delay to a feedback signal in order to realize the real time processing, as shown in FIG. 6. This circuit structure has no undelayed feedback loop and thus requires no repetitive computations, ensuring fast processing.

Figure 7:
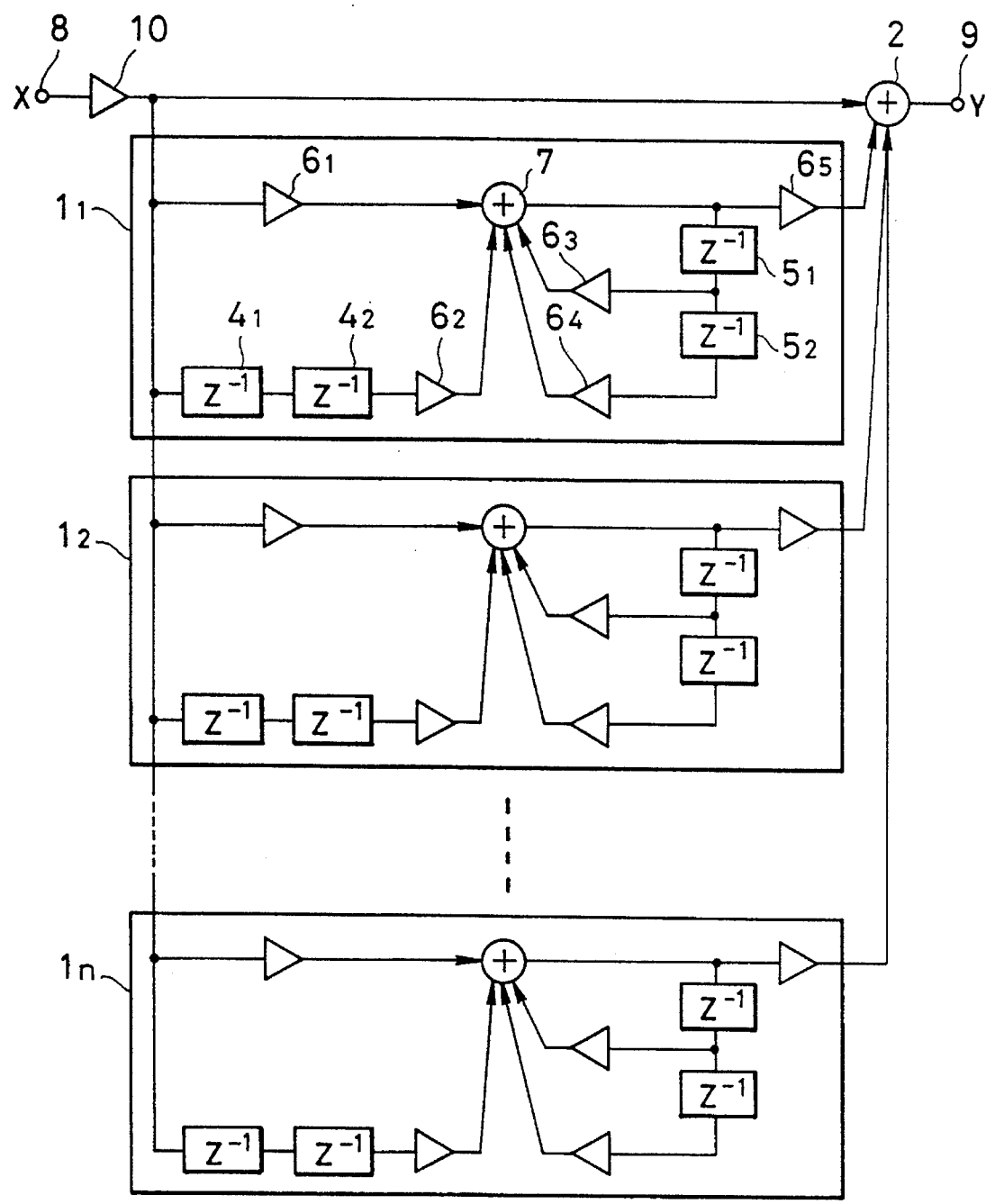
FIG. 7 is a block diagram showing a boost circuit constituted by a digital graphic equalizer according to a first embodiment of the present invention.
Figure 8:
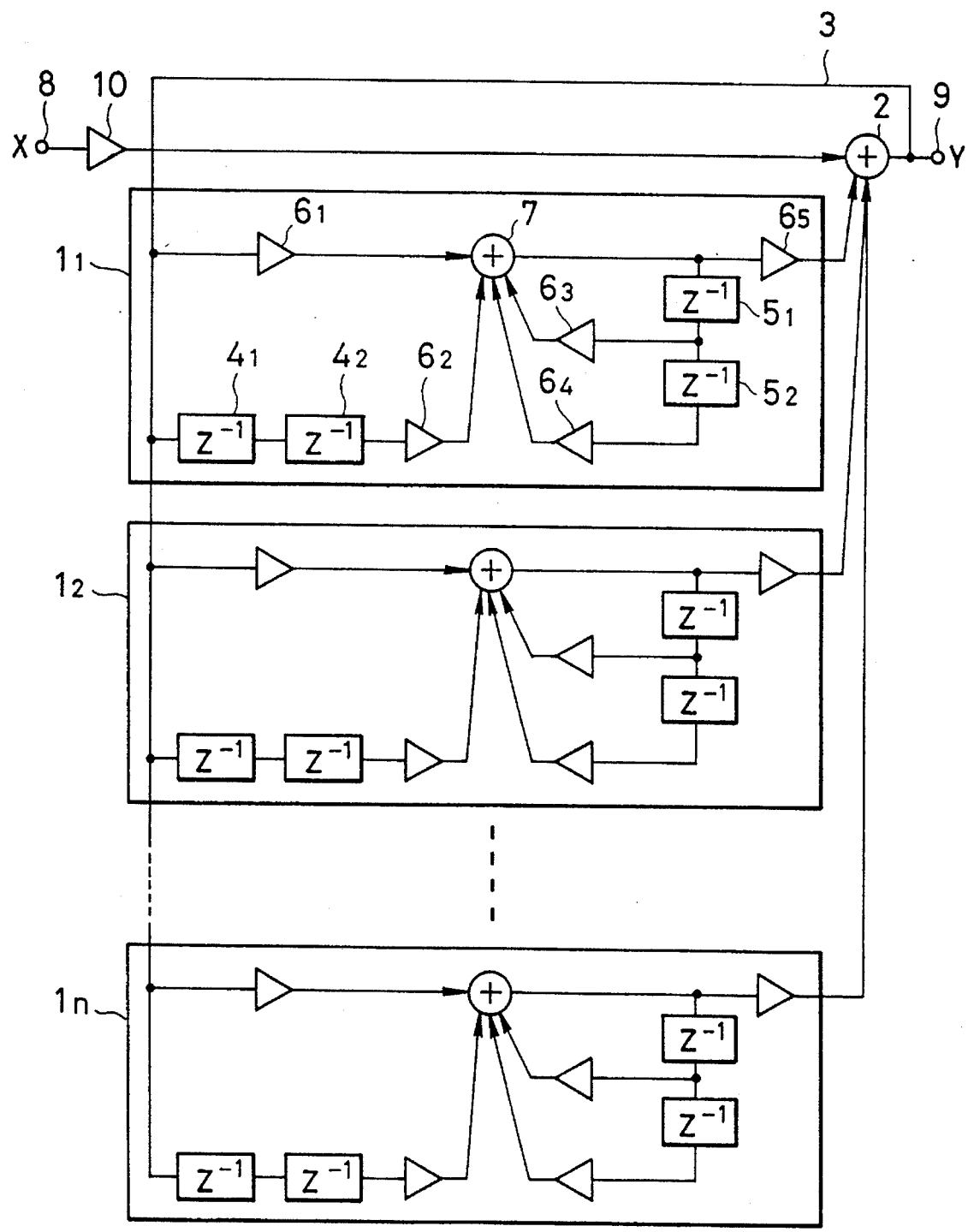
FIG. 8 is a block diagram showing an attenuation circuit constituted by the digital graphic equalizer according to the first embodiment of this invention.

A first embodiment of the present invention is illustrated in FIGS. 7 and 8.

FIG. 7 shows a boost-mode circuit (hereinafter called "boost circuit") according to the first embodiment, and FIG. 8 shows an attenuation-mode circuit (hereinafter called "attenuation circuit") according to the first embodiment.

In the first embodiment, each of the band pass filters $1_1$ to $1_n$ is constituted by a secondary IIR digital filter which comprises delay elements (delay means) $4_1$, $4_2$, $5_1$ and $5_2$, multipliers $6_1$ to $6_5$ and an adder 7. In the boost circuit in FIG. 7, a multiplier 10 and an adder 2 are connected in series between an input terminal 8 and an output terminal 9 to form a through pass, an input signal X after passing the multiplier 10 is supplied to the individual band pass filters $1_1$ to $1_n$, and the output signals of the band pass filters $1_1$ to $1_n$ are added by the adder 2. In the attenuation circuit in FIG. 8, an output signal Y or the output signal of the adder 2, is supplied via the feedback loop 3 to the band pass filters $1_1$ to $1_n$.

The operation of the boost circuit in FIG. 7 will now be discussed.

When a boost process starts, the input signal X is sent via the multiplier 10 to the adder 2 and simultaneously to the individual band pass filters $1_1$ to $1_n$. The input signal X sent to each of the band pass filters $1_1$ to $1_n$ is sent via the associated multiplier $6_1$ to the adder 7, and is also delayed by the two delay elements $4_1$ and $4_2$ before being sent via the multiplier $6_2$ to the adder 7. The output signal of the adder 7 is delayed by the two delay elements $5_1$ and $5_2$, and the resultant delayed outputs are sent to the adder 7 via the respective multipliers $6_3$ and $6_4$. The output of the adder 7 is sent via the multiplier $6_5$ to the adder 2.

Figure 9:
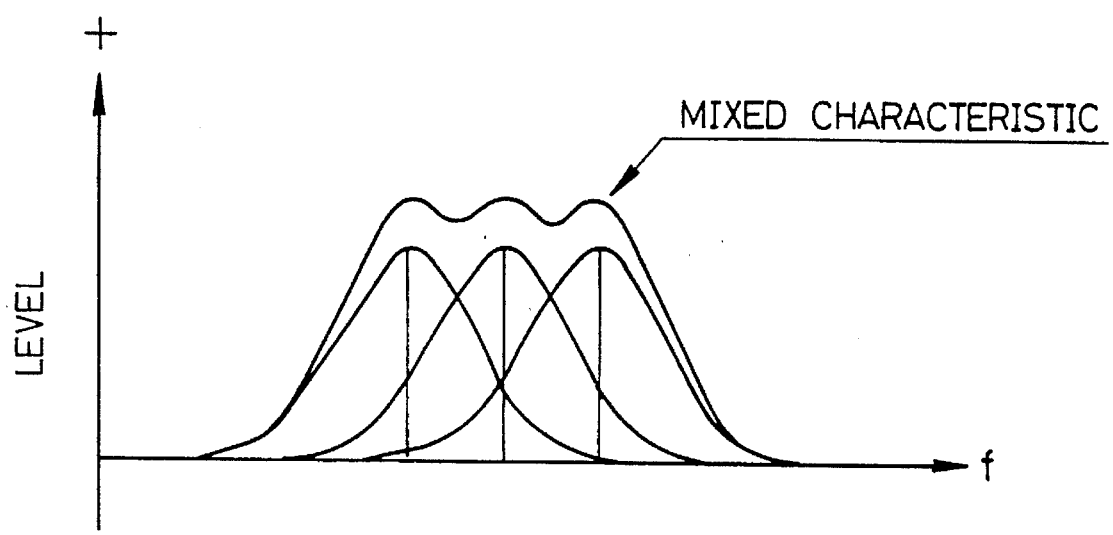
FIG. 9 is a diagram showing a frequency characteristic of the boost circuit in FIG. 7.

The adder 2 adds band pass signals sent from the individual band pass filters $1_1$ to $1_n$ to the input signal X, and outputs the added result as the output signal Y. Accordingly, the output signal Y is boosted with a predetermined frequency characteristic as exemplified in FIG. 9, which shows a 3-band digital graphic equalizer using three band pass filters.

The operation of the attenuation circuit in FIG. 8 will now be discussed.

Figure 10:
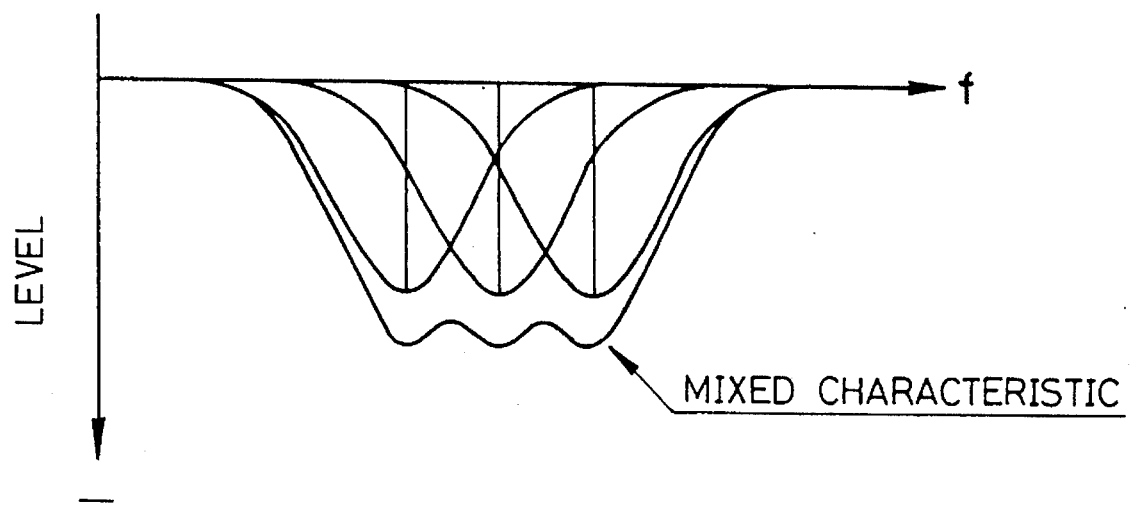
FIG. 10 is a diagram showing a frequency characteristic of the attenuation circuit in FIG. 8.

The attenuation circuit in FIG. 8 is so designed as to supply an output signal of the adder 2 or the output signal Y to the individual band pass filters $1_1$ to $1_n$ through the feedback loop 3 to invert its phase, so that the adder 2 equivalently performs a subtraction. As shown in FIG. 10, therefore, the output signal Y forms a curve vertically symmetrical to the curve shown in FIG. 9.

Figure 11:
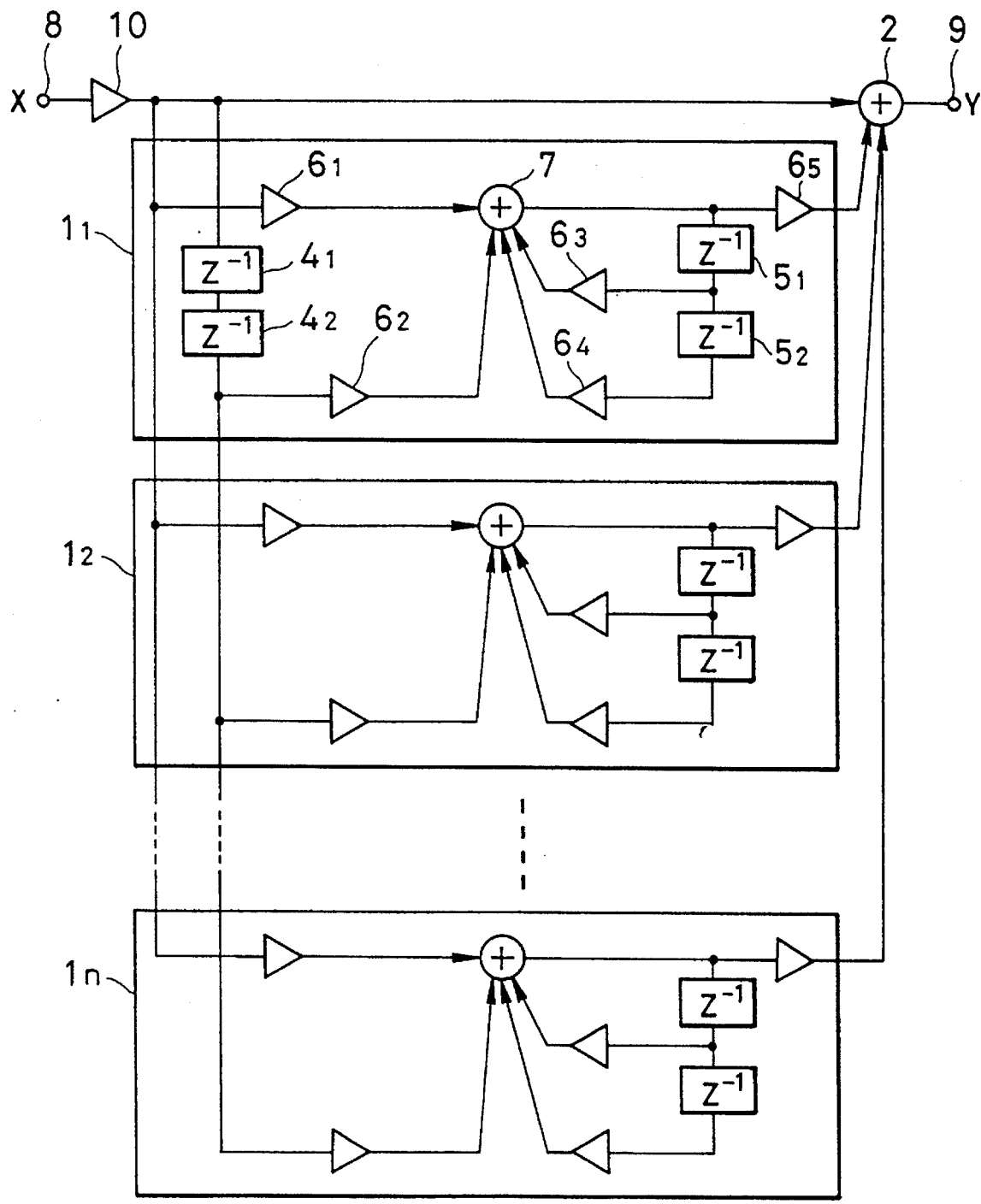
FIG. 11 is a block diagram showing a boost circuit constituted by a digital graphic equalizer according to a second embodiment of the present invention.
Figure 12:
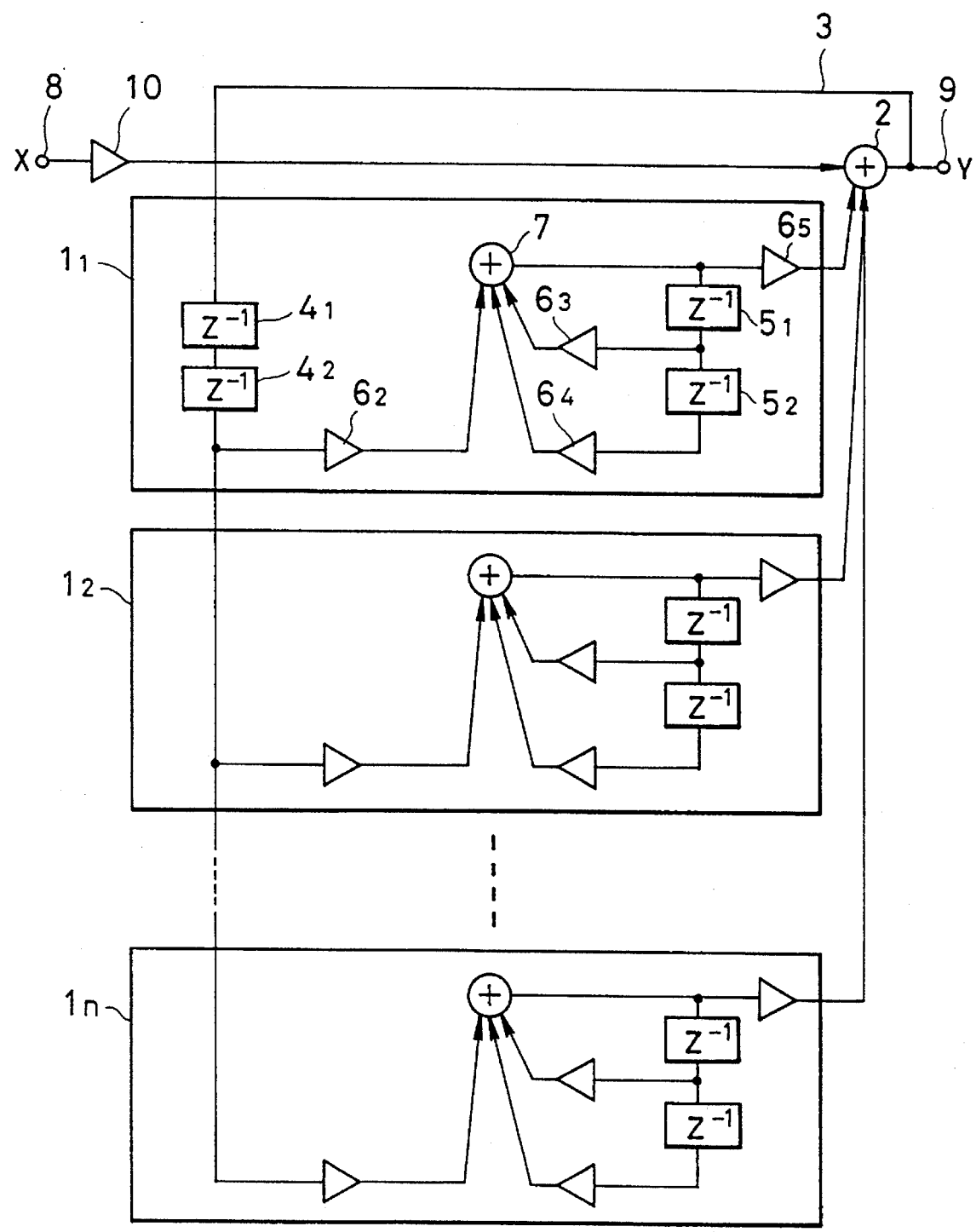
FIG. 12 is a block diagram showing an attenuation circuit constituted by the digital graphic equalizer according to the second embodiment of the present invention.

A second embodiment of the present invention is illustrated in FIGS. 11 and 12.

FIG. 11 shows a boost circuit, and FIG. 12 an attenuation circuit. The second embodiment differs from the first embodiment in that the delay elements $4_1$ and $4_2$ in one filter $1_1$ are shared by the other filters $1_2$ to $1_n$ in the boost circuit in FIG. 11 and the attenuation circuit in FIG. 12 is equivalently modified to arrange the delay elements $4_1$ and $4_2$ in the feedback loop 3 in order to eliminate an undelayed feedback loop. According to the second embodiment, particularly, the attenuation circuit in FIG. 12 does not have an undelayed feedback loop and does not therefore need repetitive computations, which are required in the first embodiment shown in FIG. 8 due to the closed loop, thus ensuring real-time processing.

Figure 13:
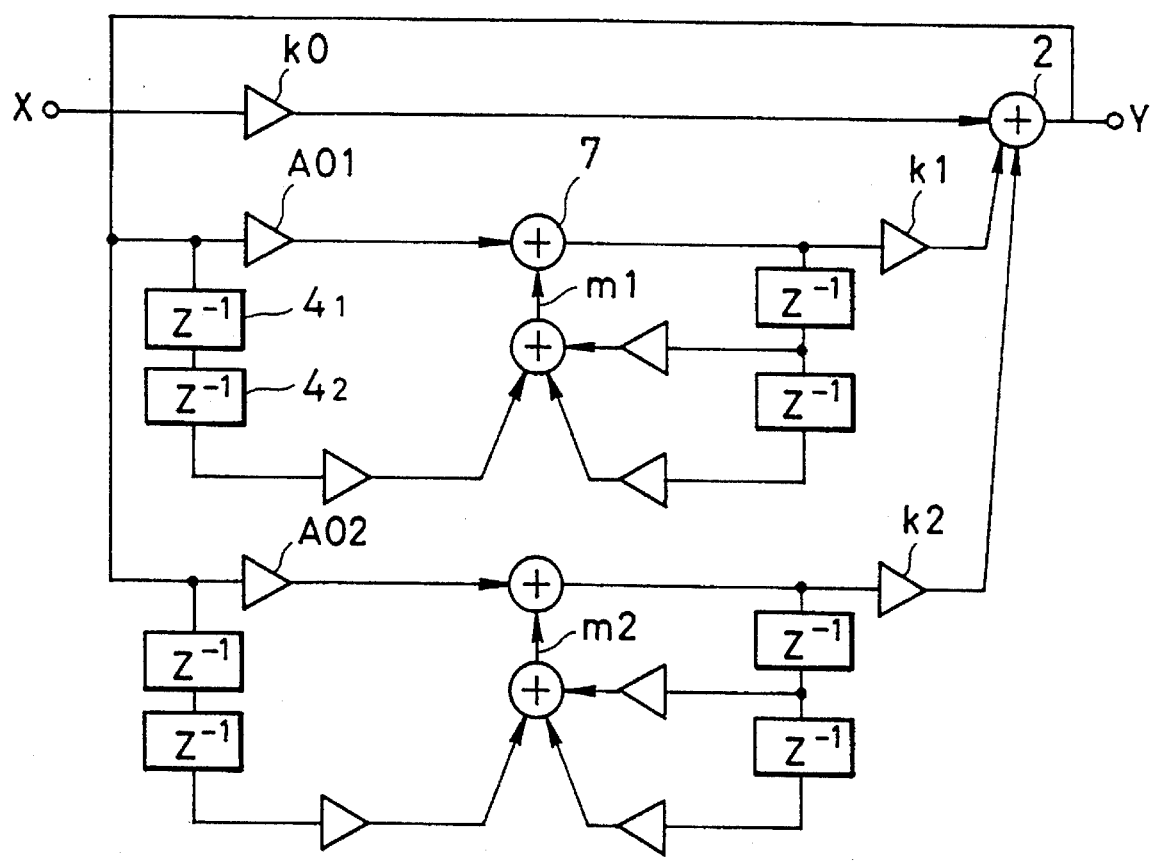
FIG. 13 is a block diagram showing the attenuation circuit in FIG. 8 constituted by two band pass filters.

The following explains that the attenuation circuit shown in FIG. 12 is equivalent to the attenuation circuit in FIG. 8. If the attenuation circuit in FIG. 8 has a 2-band structure using two band pass filters, its circuit structure is exemplarily shown in FIG. 13. In the exemplary diagram of FIG. 13, the input signal X and output signal Y have the following relation.

$$Y = X \cdot k0 + Y \cdot A01 \cdot k1 + m1 \cdot k1 + Y \cdot A02 \cdot k2 + m2 \cdot k2 \quad (7)$$

Rearranging the above equation (7) with respect to Y yields $$Y = (X \cdot k0 + m1 \cdot k1 + m2 \cdot k2)/(1 - A01 \cdot k1 - A02 \cdot k2) \quad (8)$$

It should be noted that if the following equation:

$$\alpha = 1/(1 - A01 \cdot k1 + A02 \cdot k2) \quad (9)$$

is given, substituting this equation (9) to the above equation (8) yields $$Y = \alpha \cdot (X \cdot k0 + m1 \cdot k1 + m2 \cdot k2) \quad (10)$$

Figure 14:
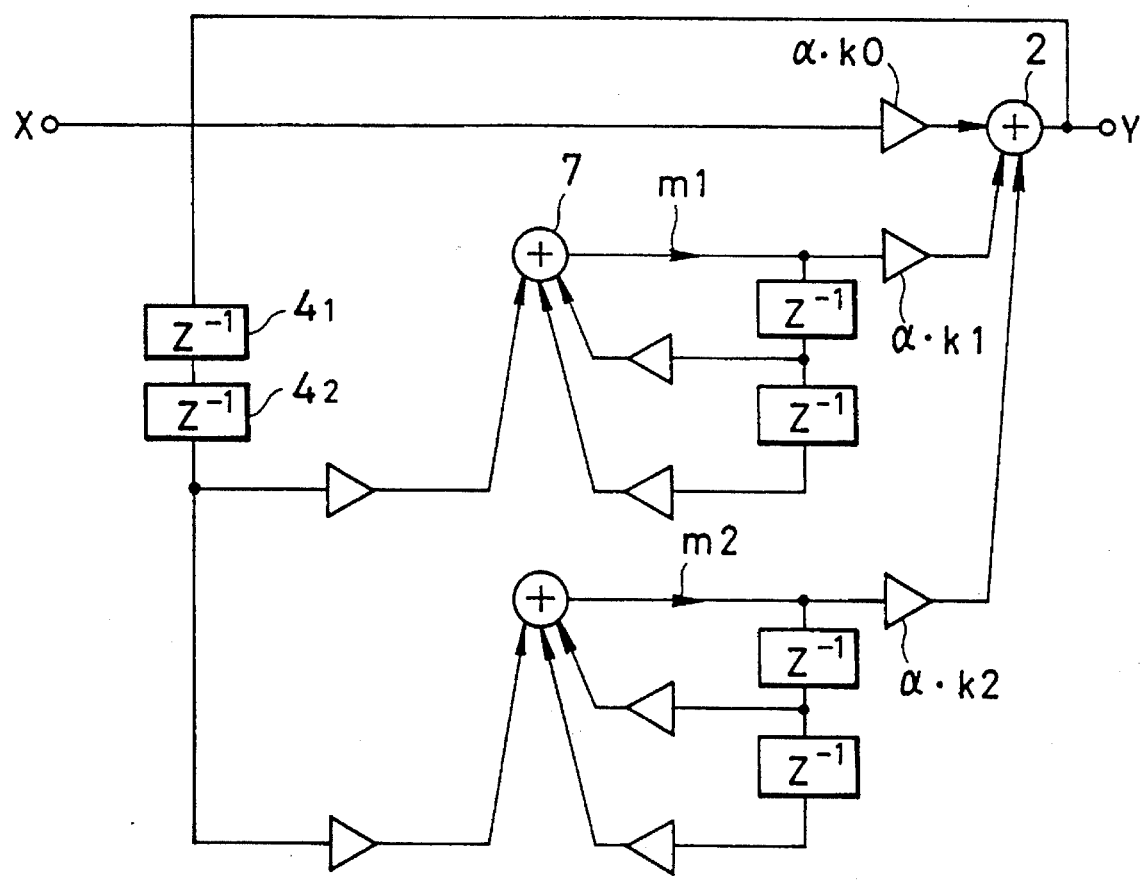
FIG. 14 is a block diagram showing an equivalent circuit obtained by transforming the circuit in FIG. 13.

An equivalent circuit of $Y = \alpha \cdot (X \cdot k0 + m1 \cdot k1 + m2 \cdot k2)$ becomes as illustrated in FIG. 14. It is apparent from the equivalent circuit in FIG. 14 that the delay elements $4_1$ and $4_2$ are arranged in the feedback loop 3. If the equivalent circuit in FIG. 14 is used to design the circuits as shown in FIGS. 11 and 12, the undelayed feedback loop 3 in the first embodiment shown in FIG. 8 can be eliminated. This can eliminate the need for convergence and approximation of computed values through the repetitive computation and can simplify the computation, thus accomplishing fast processing.

Figure 1:
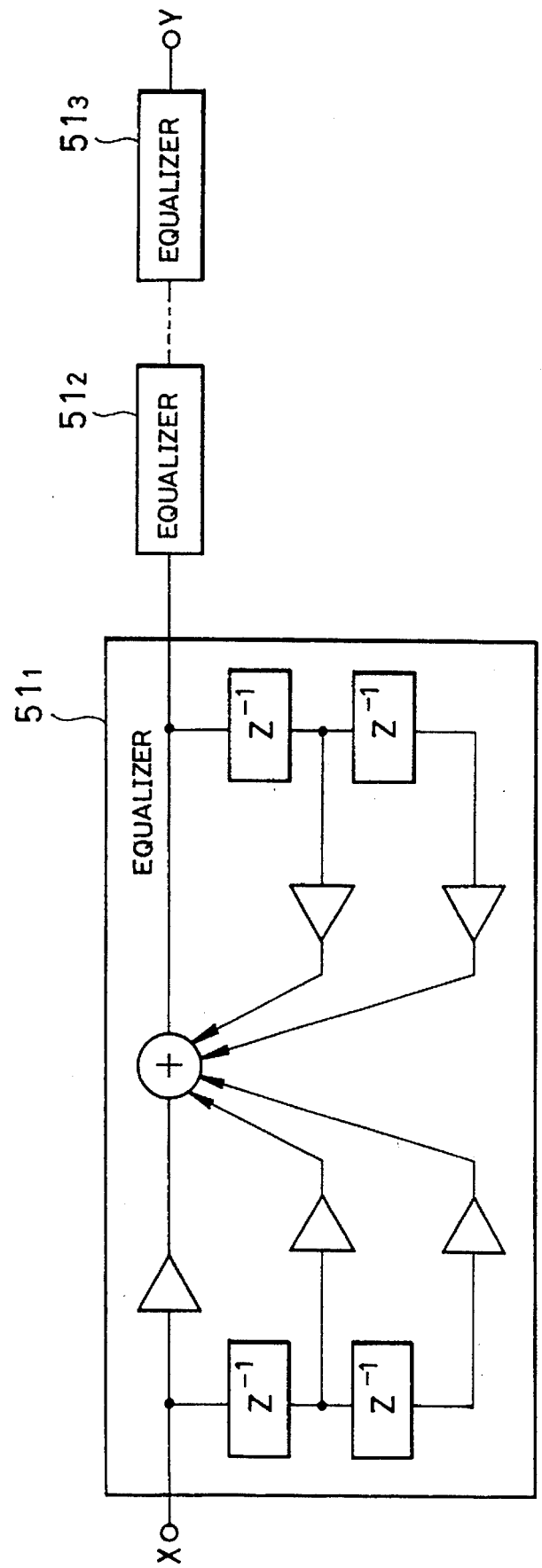
FIG. 1 is a block diagram showing an example of a cascade-connected type digital graphic equalizer.
Figure 2:
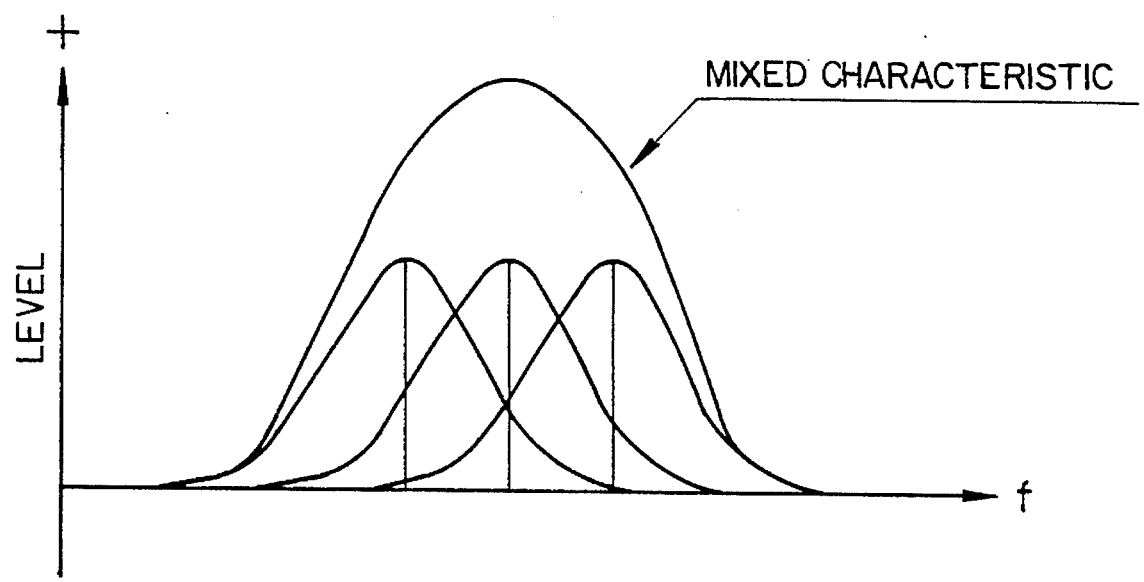
FIG. 2 is a diagram showing a boost characteristic of the digital graphic equalizer in FIG. 1.
Figure 3:
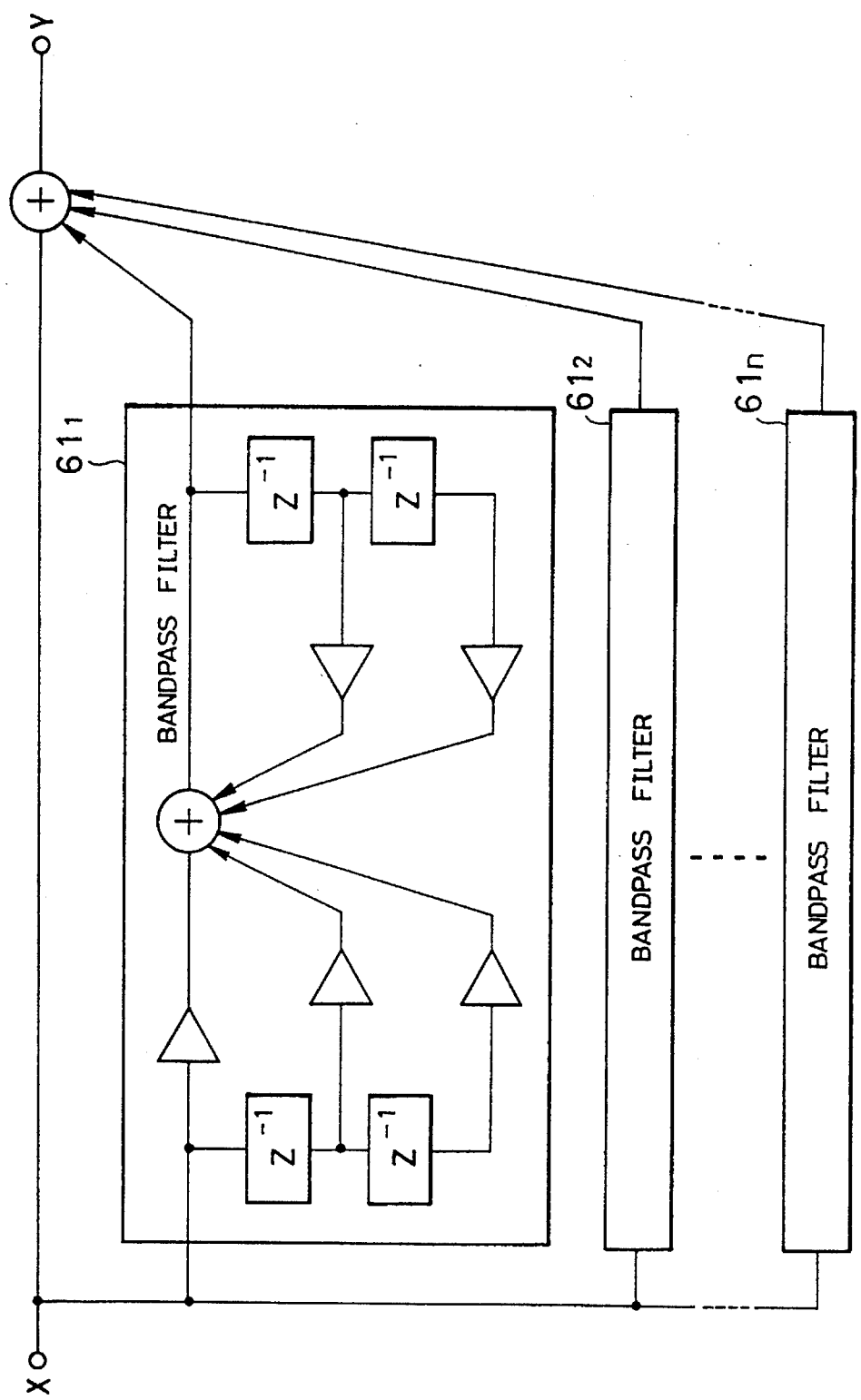
FIG. 3 is a block diagram showing an example of a parallel type digital graphic equalizer.
Figure 4:
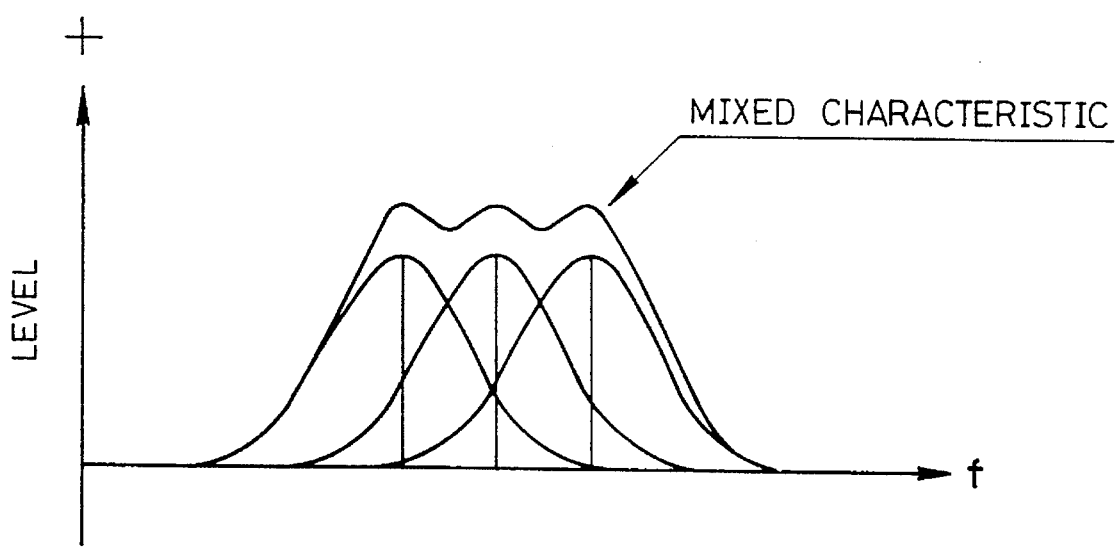
FIG. 4 is a diagram showing a boost characteristic of the digital graphic equalizer in FIG. 3.
Figure 15:
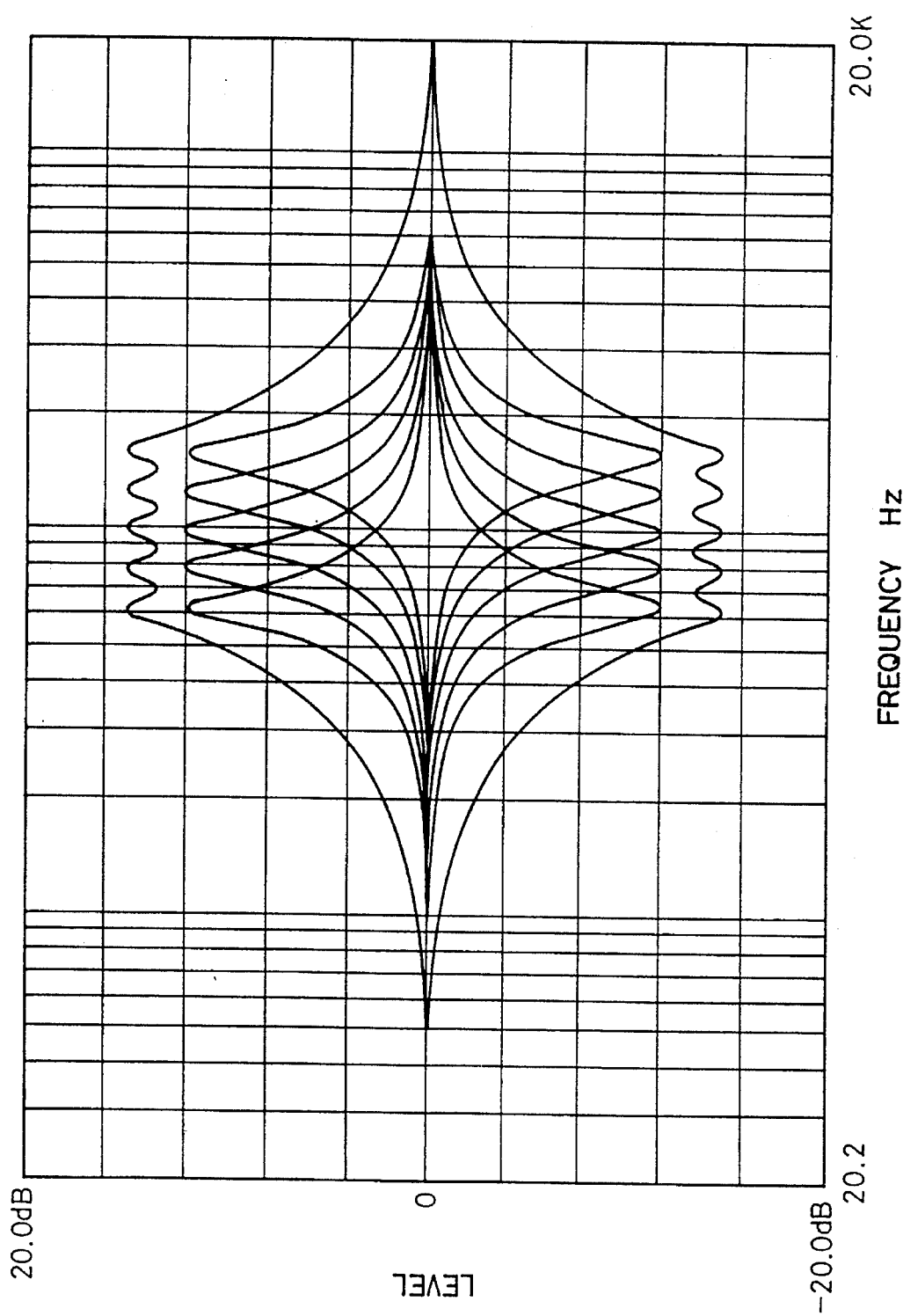
FIG. 15 is a diagram showing boost and attenuation frequency characteristics measured actually at the circuits shown in FIGS. 11 and 12.
Figure 16:
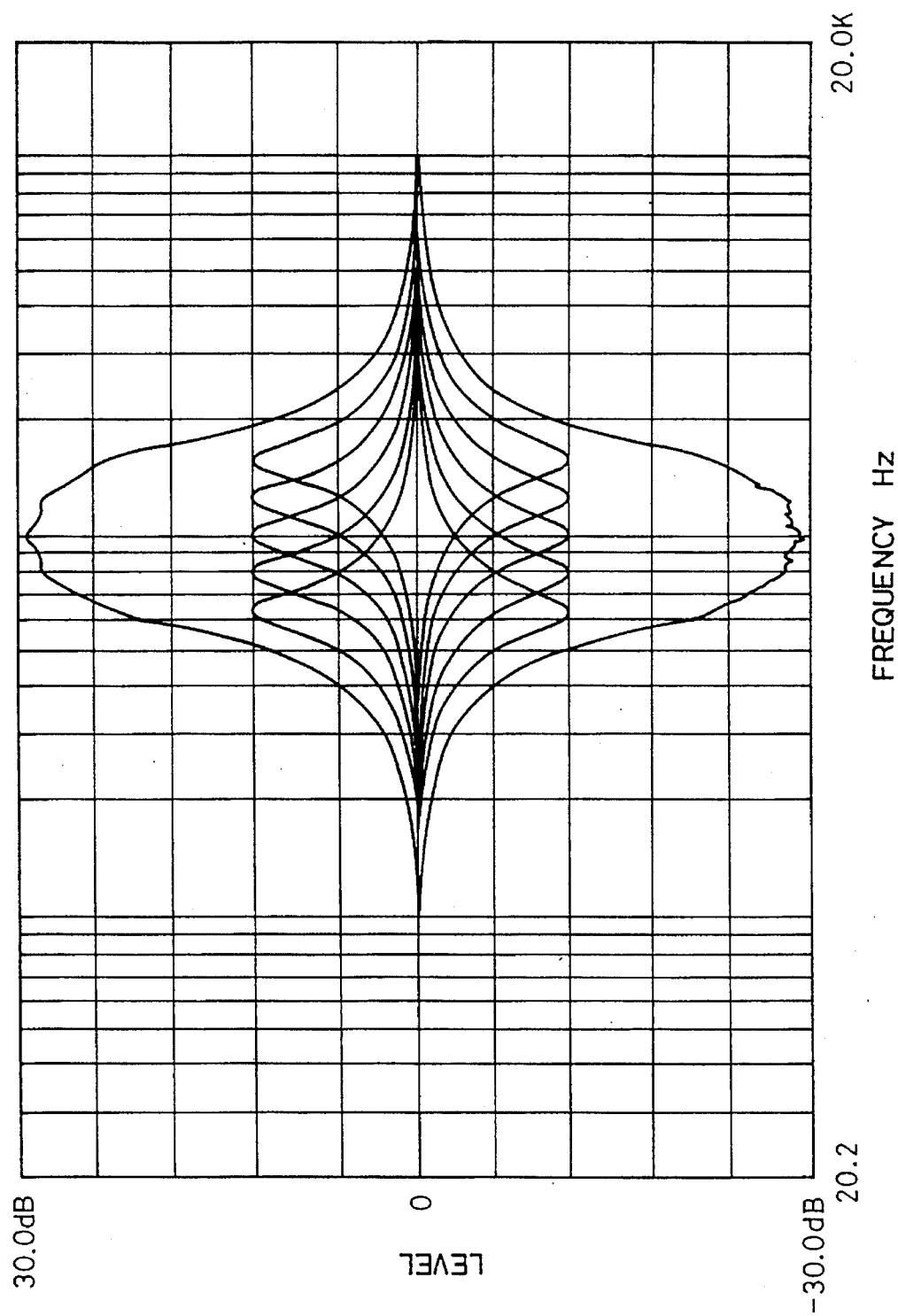
FIG. 16 is a diagram showing boost and attenuation frequency characteristics measured actually at the circuit shown in FIG. 1.

FIG. 15 shows actually measured boost and attenuation characteristics in the case where the second embodiment takes a 5-band structure using five band pass filters. FIG. 16 shows actually measured boost and attenuation characteristics for the cascade-connected type digital graphic equalizer shown in FIG. 1, which also takes a 5-band structure using five band pass filters.

It is apparent from the characteristic charts in FIGS. 15 and 16 that the present invention provides the boost-mode frequency characteristic and the attenuation-mode frequency characteristic which are completely symmetrical to each other with respect to the reference level 0 dB. Further, a change in mixed gain when the characteristics of the individual band pass filters are added is small and the total characteristic is unlikely to be saturated in both a full boost mode and a full attenuation mode, so that the S/N deterioration can be suppressed accordingly.

Although the above-described first and second embodiments both use IIR digital filters as the band pass filters $1_1$ to $1_n$, FIR (Finite Impulse Response) digital filters may also be used in place of the IIR digital filters, at the expense of a larger circuit scale. Further, the structure of the band pass filters $1_1$ to $1_n$ is not limited to those of the illustrated embodiments, but may be modified in various other forms.

In the above-described embodiments, the boost circuit and attenuation circuit are both accomplished by a DSP. More specifically, as shown in FIGS. 5A and 5B the boost circuit is realized when the DSP operates in accordance with a routine for the boost circuit in response to a boost command from a microcomputer, while the attenuation circuit is realized when the DSP operates in accordance with a routine for the attenuation circuit in response to an attenuation command from the microcomputer.

According to the digital graphic equalizer embodying the present invention, as described above, a digital graphic equalizer having band pass filters, each constituted by a digital filter, supplies an input signal to band pass filters and resultant filtered signals are then added to the input signal to obtain a desired boost characteristic in a boost mode, while an output signal is fed back to the band pass filters and resultant filtered signals are then added to the input signal to obtain a desired attenuation characteristic in an attenuation mode. Therefore, the boost characteristic and attenuation characteristic can be made symmetrical to each other with respect to a reference level, and the S/N deterioration in the full boost mode and full attenuation mode can be suppressed.

In addition, delay means is inserted in the feedback loop in the attenuation mode so that feedback is executed with a predetermined delay. This eliminates the need for convergence and approximation of computed values through the repetitive computation, thus accomplishing fast processing.

What is claimed is:

1. A digital graphic equalizer for obtaining a boost characteristic and an attenuation characteristic using a digital signal processor which realizes band pass filters, each constituted by a digital filter, and adding means, said equalizer comprising:

first band pass filters for receiving an input signal to obtain first filtered signals in a boost mode;

first adding means for adding said first filtered signals and said input signal to obtain a boost output signal in said boost mode;

second band pass filters for receiving an attenuation output signal to obtain second filtered signals in a attenuation mode; and second adding means for adding said second filtered signals and said input signal to obtain said attenuation output signal in said attenuation mode.

2. The digital graphic equalizer according to claim 1, further comprising delay means realized in said digital signal processor, for delaying a signal to be fed from said second adding means to said second band pass filters in said attenuation mode.

* * * * *